United States Patent

Hermanns

[15] 3,700,156

[45] Oct. 24, 1972

[54] BONDING HEAD FOR BONDING BEAM LEADED DEVICES TO A SUBSTRATE

[72] Inventor: Leonard S. Hermanns, Woburn, Mass.

[73] Assignee: Mech-El Industries, Inc., Woburn, Mass.

[22] Filed: May 20, 1970

[21] Appl. No.: 39,023

[52] U.S. Cl. ....................228/4, 29/470.1, 29/497.5, 29/626, 78/82, 228/3, 228/45

[51] Int. Cl. ..........................B23k 1/00, B23k 37/04

[58] Field of Search ......78/82; 219/78; 228/1, 3, 3.5, 228/4, 5, 45; 29/470.1, 471.1, 497.5, 626

[56] References Cited

UNITED STATES PATENTS

| | | | |
|---|---|---|---|
| 3,475,814 | 11/1969 | Santangini | 29/497.5 X |
| 3,505,726 | 4/1970 | Kleinedler et al. | 29/497.5 X |
| 3,574,923 | 4/1971 | Cushman | 29/479.5 X |
| 3,575,333 | 4/1971 | Kulicke, Jr. | 29/470.1 |

*Primary Examiner*—John F. Campbell
*Assistant Examiner*—R. T. Craig
*Attorney*—James J. Cannon, Jr.

[57] ABSTRACT

An improved beam leaded bonding method and head wherein a bonding surface is caused to individually and successively contact and bond each of a plurality of electrical leads projecting from around the periphery of a beam leaded device onto a substrate. A particular mechanical bonding head is illustrated for moving a bonding tool in a complex "wobbling" fashion to produce the desired individual and successive automatic lead bonding.

6 Claims, 5 Drawing Figures

Figure 1:
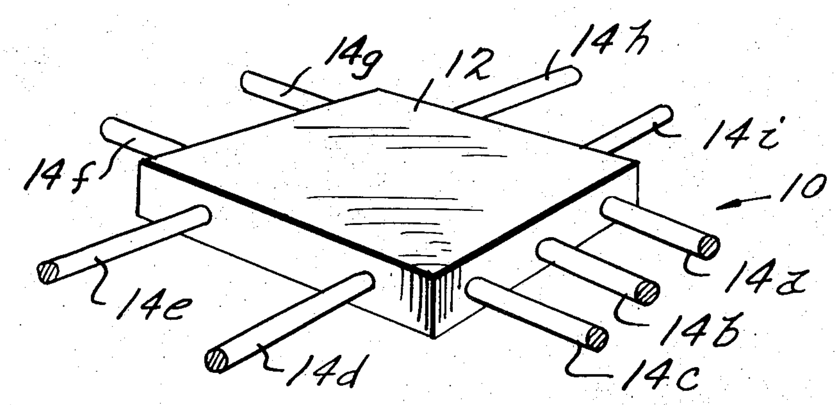

INVENTOR
LENORD S. HERMANNS
BY Cushman, Darby & Cushman
ATTORNEYS

INVENTOR

LENOARD S. HERMANNS

BY Cushman, Darby & Cushman

ATTORNEYS

BONDING HEAD FOR BONDING BEAM LEADED DEVICES TO A SUBSTRATE

This invention generally relates to an improved bonding method and head for bonding electrical leads projecting from a beam leaded device onto mating contact surfaces of a substrate.

In the electrical art it is often necessary to bond a plurality of rather small and delicate electrical leads projecting from a so-called "beam leaded device" onto mating conductor portions of a substrate. For instance, the beam leaded device may comprise an integrated circuit subcomponent which, after bonding to a substrate, may form part of a larger more sophisticated electronic device incorporating other integrated circuits or standard size components interconnected by elements associated with the substrate.

Initially, the electric leads of such beam leaded devices were individually welded in a time consuming and laborous manual process to each mating portion of the substrate. Later improvements in the art included the use of bonding tools for simultaneously bonding all of the plurality of electrical leads from a single beam leaded device at one time. While this improvement substantially reduced the amount of time and labor involved in bonding such devices to substrates, there were still substantial problems involved in that the electrical leads were not uniformly bonded to the substrate.

Specifically, the electrical leads themselves are often of non-uniform diameters and the substrate surface may not be perfectly planar nor of uniform thickness but may in fact itself possess substantial irregularities over its surface. In addition, the bonding head may not be precisely aligned in a plane parallel to either the substrate or to the electrical leads. The net result of all these irregularities is undesirable non uniformity in the mechanical and electrical properties of the various bonds effected by simultaneous beam leaded bonding.

Later improvements in simultaneous bonding such as those described in U. S. Pat. No. 3,442,432 — Santangini and U. S. Pat. No. 3,452,917 — Schneider attempted to alleviate some of these problems by respectively providing pivotal movements of the base structure supporting the substrate or of the bonding head to effect substantially greater uniformity in the bonding pressures applied to each of the electrical leads in a simultaneous bonding process. In essence, both of these devices permit compensation for relative non-parallel planar alignments of the bonding head and substrate surface. However, even these improvements still leave much to be desired in obtaining uniform bonding of the electrical leads since the three highest points about the periphery of a beam leaded device (including substrate thickness variations and electrical lead diameter variations) necessarily define a plane which the planar bonding surface must necessarily contact first and thus must necessarily exert greater pressure at these points than at other relatively depressed bonding points. Thus, even if the head and/or base are permitted to pivot as in the previously mentioned patented devices, there will still be substantial non-uniformity in the resulting electrical and mechanical bonds between the leads and the substrate where the bonds are effected simultaneously.

Accordingly, it is an object of this invention to provide an improved bonding method for automatically producing individual and successive bonds of beam leads onto a substrate. Since only one electrical lead is bonded to the substrate at any given point in time, each bond is effected under substantially controlled conditions, thereby causing each of a plurality of bonds to exhibit substantially uniform mechanical and electrical properties and, since all the leads are automatically sequentially bonded in only a very short time, the time and labor saving advantages of the simultaneous bonding technique are realized without the problems of non-uniform bonding.

It is a further object of this invention to provide a specific bonding head for "wobbling" a bonding tool in a complex motion causing the bonding surface about the edge of one end of a bonding tool to successively contact electrical leads projecting from a beam leaded device in position for welding to a mating substrate disposed thereunder.

Figure 2:
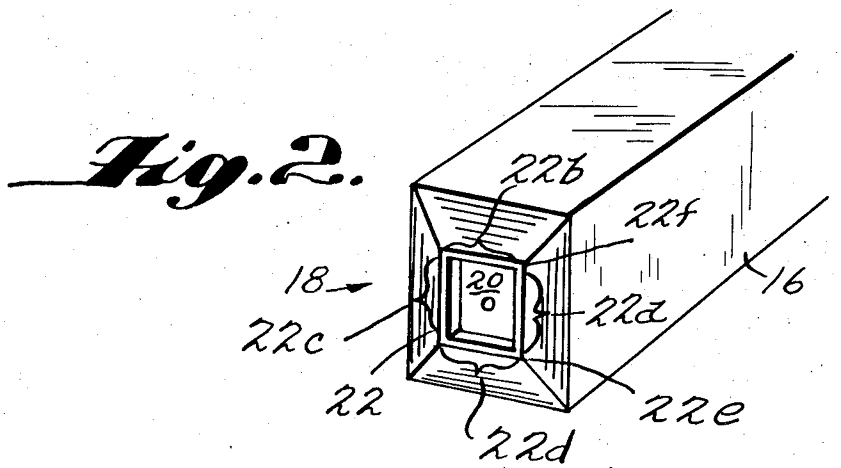
Figure 3:
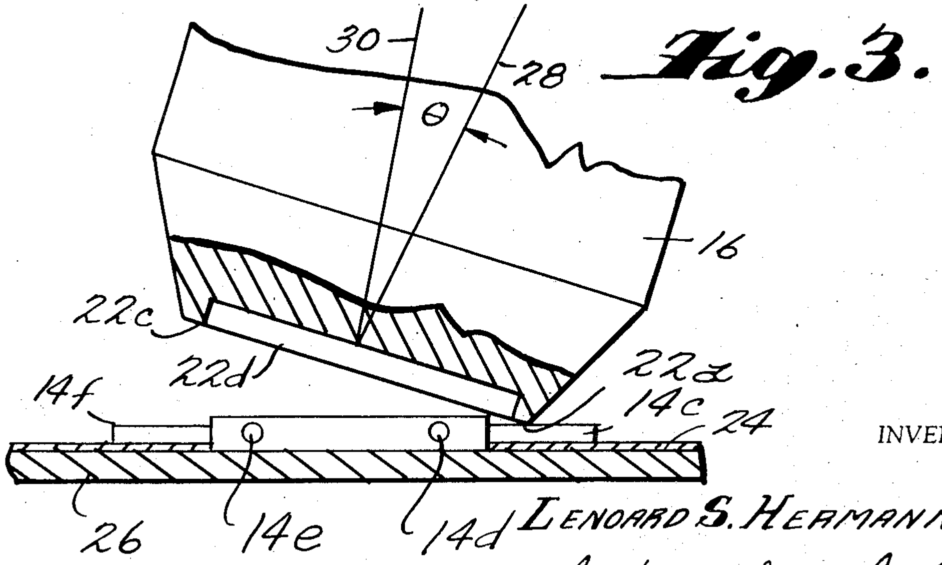
Figure 4:
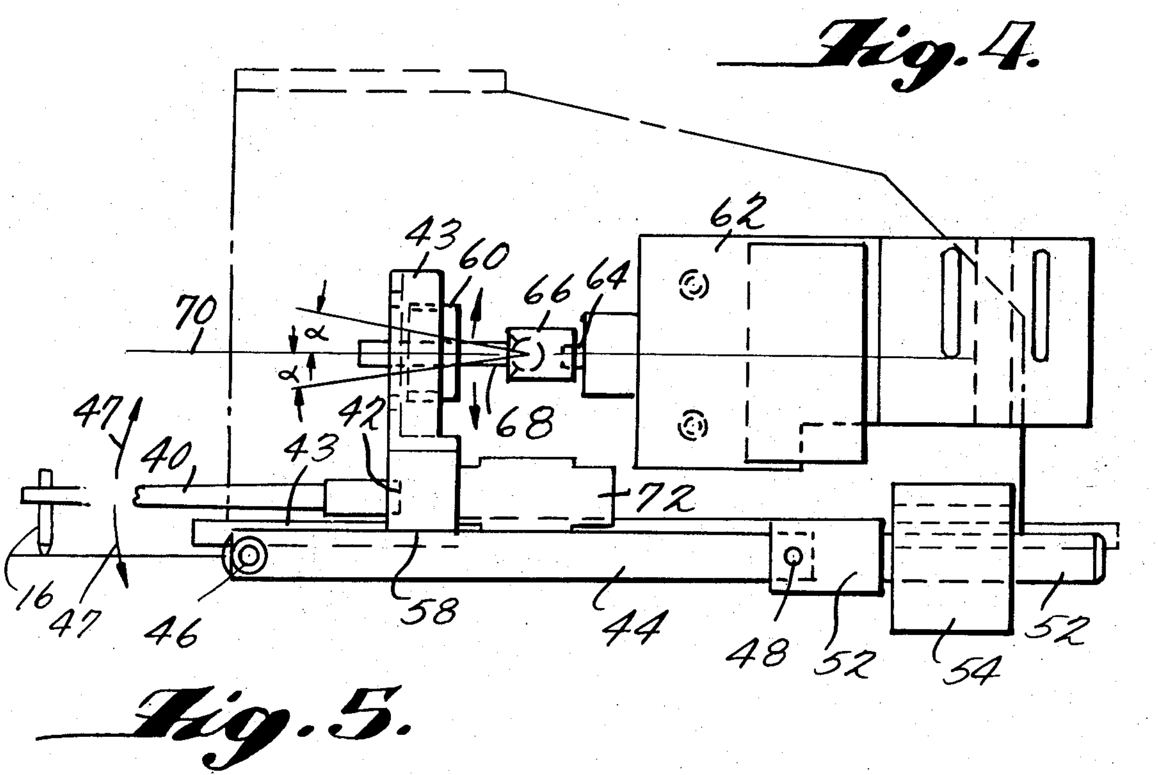
Figure 5:
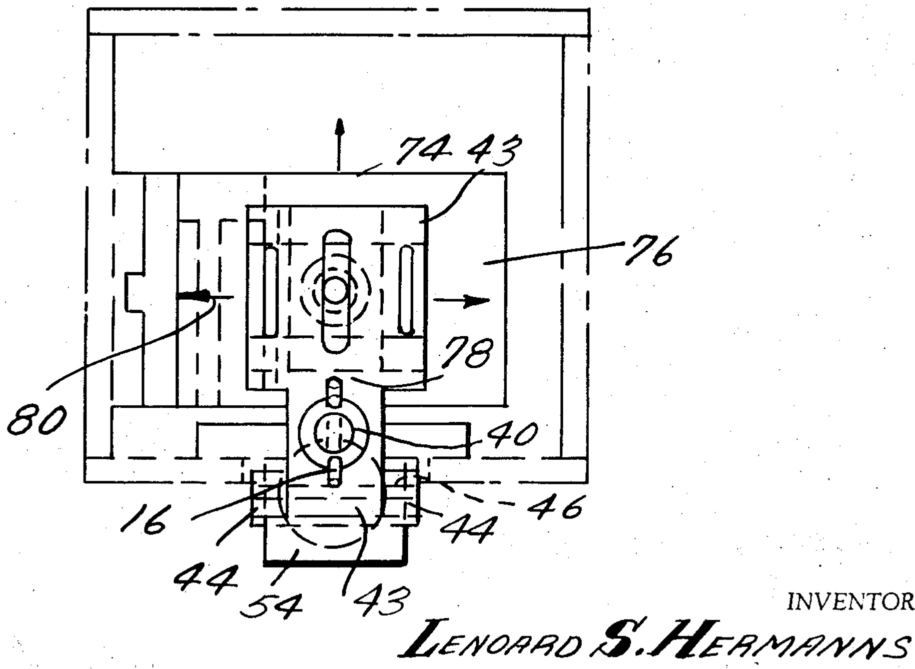

A more complete understanding of this invention may be obtained by carefully studying the following detailed description in combination with the drawings of which:

FIG. 1 is a pictorial illustration of a beam leaded device of the type which may be used with this invention, FIG. 2 is a pictorial end view of a bonding tool which may be used with this invention, FIG. 3 is a partial cross sectional side view of the bonding tool of FIG. 2 as shown at a point during the improved welding process of this invention, FIG. 4 is a pictorial side view of a bonding head apparatus which may be used for practicing this invention, and FIG. 5 is a pictorial end view of the apparatus shown in FIG. 4.

As shown in FIG. 1, a beam leaded device 10 comprises a body portion 12 and various electrical beam leads 14. In welding the leads 14 to mating conductive portions of a substrate, a tool similar to that illustrated in FIG. 2 is often used. As shown in FIG. 2, the bonding tool 16 has an end portion 18 which includes a hollow recess 20 and a bonding surface 22 substantially disposed about the periphery of recess 20. In operation, the bonding tool is lowered such that recess 20 fits over the body 12 of the beam leaded device 10 in position for welding leads 14 onto a substrate. The bonding energy (such as thermal energy, pressure or ultrasonic vibration) is applied through bonding surface 22 to the leads 14 and a mating substrate portion.

This invention is intended to reap the labor and time saving advantages of the previously discussed simultaneous bonding techniques but with a substantial improvement in uniformity of individual bonds. Thus, in effect, the benefits of the early one-at-a-time bonding techniques and the later simultaneously bonding techniques are combined in this invention by automatic individual and successive bonding of a plurality of electrical leads projecting from a beamed leaded device and by carrying out this process in a very short time period.

The improved results are obtained by moving a bonding tool such as that shown in FIG. 2 in a complex "wobbling" fashion about the circumference of its bonding surface 22 such that the bonding of individual electrical leads located beneath the bonding surface is effected in a rapid but definitely sequential manner. That is, if only the leads along a single side of bonding surface 22 are initially considered (for instance, side 22*a*), tool 16 is first tilted such that corner 22*e* is closest to the beam leaded device and its mating substrate portions. Then, the bonding tool is rocked forward such that sides 22*b*, 22*c* and 22*d* remain relatively out of contact with any of the electrical leads while the surface along side 22*a* is continuously lowered against the leads such that a point of bonding contact progressively moves from corner 22*e* to corner 22*f*, then electrical leads such as 14*a*, 14*b*, 14*c* will be successively bonded in that respective order as the tool is rocked or "wobbled" along that side. If the tool is then likewise rocked from corner 22*f* along side 22*b* and then along side 22*c* and finally along side 22*d*, then it will be seen that a plurality of leads 14*a* through 14*i* will be individually, successively and sequentially bonded in that respective order. Since only one lead is bonded under controlled conditions at any given time, substantially more uniform bonds are effected for each of the separate leads.

This process is shown in FIG. 3 at a point in time when lead 14*c* is about to be welded to mating electrical surface 24 on substrate 26. As shown in the drawing, the longitudinal axis 28 of the tool 16 is disposed at an angle (i.e., tilted to keep surfaces 22*b*, 22*c* and 22*d* out of bonding contact with the electrical leads) with respect to the perpendicular 30. In the drawing, this angle $\theta$ is shown greatly exaggerated since, in practice, only a very small angle is necessary.

If the bonding surface 22 of the tool were reduced to a simple mathematical point, then the motion of the longitudinal axis 28 of bonding tool 16 would generate a conical surface having a half-angle equal to $\theta$. However, because the bonding surface 22 cannot be a simple point but must rather be an area of considerable finite size, the actual motion described by the tool 16 is in practice not a simple cone but rather a very complicated movement determined at least by the angle $\theta$ and by the configuration and size of bonding surface 22. For lack of a better term, (there is no known precise mathematical term) this complex motion of the bonding tool 16 while moving bonding surface 22 successively about the periphery of a beam leaded device to successively and individually bond a plurality of projecting beam leads will be described as "wobbling."

A particular apparatus for causing such "wobbling" motion is depicted in FIG. 4. Here the bonding tool 16 is suspended at the end of a supporting shaft 40 which is attached at point 42 to a bearing mount 43. Bearing mount 43 extends downwardly and to the left (this horizontal portion is hidden in FIG. 4) where it is universally pivoted at 46 to a beam 44. This pivot point is freely suspended and thus permits arcuate vertical movements of shaft 40 with respect to beam 44 as indicated at 47.

The other end of the beam 44 is universally pivoted at 48 with a shaft 52 which is free to rotate about its longitudinal axis within the radial bearing 54.

As previously mentioned, a driving structure or bearing mount 43 extends downwardly to a point 58 and then to the left to pivot at 46 with beam 44. Within the vertical portion of 43 is a self-aligning universally pivotable bearing 60. Thus the pivot at 46 permits shaft 40 to undergo arcuate movements as at 47. In addition, the radial bearing 54 permits beam 44 to rotate and therefore permits the shaft 40 to simultaneously undergo arcuate movements substantially transverse to the movements as indicated at 47. Obviously if these two basic movements are properly mixed, the tool 16 will move in the desired "wobbling" mode.

To accomplish such movements, the center line of support 43 (to which shaft 40 is attached at 42) must be moved in a substantially circular path transverse to the plane of the paper in FIG. 4 or to the longitudinal axis of shaft 44 while at the same time being free to move slightly to the left and to the right to compensate for the complex "wobbling" movements. Thus a driving shaft 68 used for moving bearing 60 (as described below) is free to move slightly in and out of the bearing to compensate for such non-transverse movements.

A convenient means for producing this transverse substantially circular driving motion is also shown in FIG. 4. Briefly, an electric motor 62 turns a shaft 64 aligned with the nominal center of bearing 60. This electric motor shaft is rigidly attached to one end of a coupling 66 and a driving shaft 68 is rigidly attached to coupling 66 at an angle $\alpha$ with respect to the center line 70 of shaft 64. Thus, when the motor 62 is energized and shaft 64 is rotated, the driving shaft 68 will describe a mathematical cone having a half-angle of $\alpha$ and bearing 60 will be forced to follow a substantially circular path substantially corresponding to a cross section of the cone. Of course, as previously mentioned, the motion will also include slight non-transverse components due to the complex nature of the desired "-wobbling" motion of tool 16. As shown in FIG. 4, the shaft 68 is projecting either into or out of the plane of the paper at an angle $\alpha$.

By simply moving the motor 62 to the right or to the left in FIG. 4, the diameter of the conical cross section may be increased or decreased respectively thereby increasing or decreasing the amplitude of the "wobble" imparted to tool 16. Of course, it should be apparent that a 360° rotation of shaft 64 will result in a 360° "-wobble" by tool 16 thereby effecting sequential bonding of all the leads from a single beam leaded device by a single revolution of motor 62.

It should be particularly pointed out that the dimensions of this machine must be carefully laid out to insure the desired "wobbling" movement of tool 16. Specifically pivot 46 should be maintained as close to tool 16 as possible since the most ideal case would be for pivot 46 to be coincident with the working end of tool 16. Likewise, both pivot points 46 and 48 and the center line of bearing 54 are preferably nominally maintained in a common plane with the working end of tool 16. In addition, the dimensions of the bearing mount 43 and the placement of motor 62 with respect thereto are, of course, important factors in determining the resultant motion of tool 16. However, since such mechanical design is well within the skill of the art once the basic structure of FIG. 4 is disclosed, it will not be further discussed at this point.

Thus, the apparatus of FIG. 4 may be used to cause the bonding surface of tool 16 to successively and individually bond a plurality of leads from a beam leaded device into a substrate as has been previously described. A transducer such as an ultrasonic transducer may also be incorporated as at 72 to provide bonding energy to the bonding surface of tool 16.

An end view of the device of FIG. 4 is shown in FIG. 5 wherein the generally transverse movements of driving bearing 60 are schematically indicated by the arrows 74 through 80. As seen in this view, bearing support 43 actually depends into a center cutout portion of beam 44 where it is pivoted at 46.

While only a single embodiment of this invention has been specifically disclosed in the foregoing specification, it will be obvious to those skilled in the art that many modifications of the disclosed embodiment are possible which would still result in the desired "-wobbling" movement of the bonding tool. Accordingly, all such modifications are intended to be included within the scope of this invention.

I claim:

1. An apparatus for bonding electrical leads projecting from a beam leaded device onto mating conductive surfaces on a substrate using a bonding surface disposed substantially about the periphery of one end of a bonding tool, said apparatus comprising:

mounting means for mounting said tool in radial fashion with the longitudinal axis of said tool perpendicular to the longitudinal axis of said mounting means, said mounting means permitting predetermined adjustable wobbling movements of said tool whereby said bonding surface may sequentially make a bonding contact with said electrical leads, while compensating for lateral displacement of the beam leaded device and the individual leads and while compensating for unequal distances of the point of bond from the center point of the beam leaded device; and driving means for causing said mounting means to undertake said predetermined adjustable wobbling movements thereby permitting each of said electrical leads to be substantially individually and sequentially bonded to said substrate.

2. An apparatus as in claim 1 including:

a transducer mount in radial alignment with said bonding tool for mounting and wobbling an ultrasonic transducer, the longitudinal axis of said transducer mount perpendicular to the longitudinal axis of said bonding tool, for supplying bonding energy to said tool at least during said wobbling movements.

3. An apparatus as in claim 2 wherein said radial mounting means comprises:

a supporting shaft for holding said bonding tool;

a transducer mounting block connected to one end of said supporting shaft in radial alignment with said bonding tool;

an ultrasonic transducer mounted on said transducer mounting block;

a beam having two ends;

an unsupported universal pivot effectively connected to said supporting shaft at one end of said beam; and a rotatably supported universal pivot at the other end of said beam.

4. An apparatus as in claim 3 wherein said driving means comprises:

a self-aligning universally pivoted bearing;

a bearing support attached to said supporting shaft and to said unsupported pivot; and rotating means for moving the center of said bearing along a substantially circular path which is substantially transverse to said beam.

5. An apparatus as in claim 4 wherein said rotating means is driven by an electric motor having a rotatable shaft and wherein said rotating means further includes:

a driving shaft for slidable connection to the center of said bearing; and a coupling for angularly coupling said drive shaft to the said electric motor shaft thereby causing said drive shaft to generate a generally conical surface of revolution upon rotation of said electric motor shaft, and causing said bearing to move in a predetermined path generally corresponding to the wobbling movement of the bonding tool about the periphery of the beam leaded device as it bonds each lead.

6. An apparatus as in claim 5 wherein said coupling effects a preset angle between said drive shaft and said electric motor shaft.

* * * * *